United States Patent
Yamaguchi et al.

(10) Patent No.: US 8,022,445 B2
(45) Date of Patent: Sep. 20, 2011

(54) METHOD OF MANUFACTURING A SEMICONDUCTOR DEVICE

(75) Inventors: Tadashi Yamaguchi, Tokyo (JP);
Keiichiro Kashihara, Tokyo (JP);
Tomonori Okudaira, Tokyo (JP);
Toshiaki Tsutsumi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/510,026

(22) Filed: Jul. 27, 2009

(65) Prior Publication Data

US 2009/0291537 A1    Nov. 26, 2009

Related U.S. Application Data

(62) Division of application No. 11/771,340, filed on Jun. 29, 2007, now abandoned.

(30) Foreign Application Priority Data

Jul. 3, 2006   (JP) .................................. 2006-183133

(51) Int. Cl.
*H01L 29/04* (2006.01)
(52) U.S. Cl. ...................................... 257/255
(58) Field of Classification Search .................... 257/255
See application file for complete search history.

(56) References Cited

U.S. PATENT DOCUMENTS

| | | | | |
|---|---|---|---|---|
| 6,326,291 | B1 * | 12/2001 | Yu | 438/592 |
| 7,396,767 | B2 * | 7/2008 | Wu et al. | 438/682 |
| 2002/0081794 | A1 | 6/2002 | Ito | |
| 2003/0146458 | A1 | 8/2003 | Horiuchi et al. | |
| 2005/0093105 | A1 | 5/2005 | Yang et al. | |
| 2005/0247983 | A1 * | 11/2005 | Ting | 257/408 |
| 2007/0077736 | A1 | 4/2007 | Yamaguchi et al. | |

FOREIGN PATENT DOCUMENTS

JP  2005-150267  6/2005
JP  2006228859 A * 8/2006

* cited by examiner

*Primary Examiner* — David Vu
*Assistant Examiner* — Brandon Fox
(74) *Attorney, Agent, or Firm* — Oblon, Spivak, McClelland, Maier & Neustadt, L.L.P.

(57) ABSTRACT

A method of manufacturing a semiconductor device, including the steps of preparing a silicon substrate which has a main surface whose plane direction is a surface (100); forming an n channel MISFET (Metal Insulator Semiconductor Field Effect Transistor) which has a gate electrode, a source region, a drain region and a channel whose channel length direction is parallel to a crystal orientation <100> of the silicon substrate; and forming NiSi over the gate electrode and $NiSi_2$ over the source region and the drain region at the same steps.

2 Claims, 13 Drawing Sheets

F I G . 6
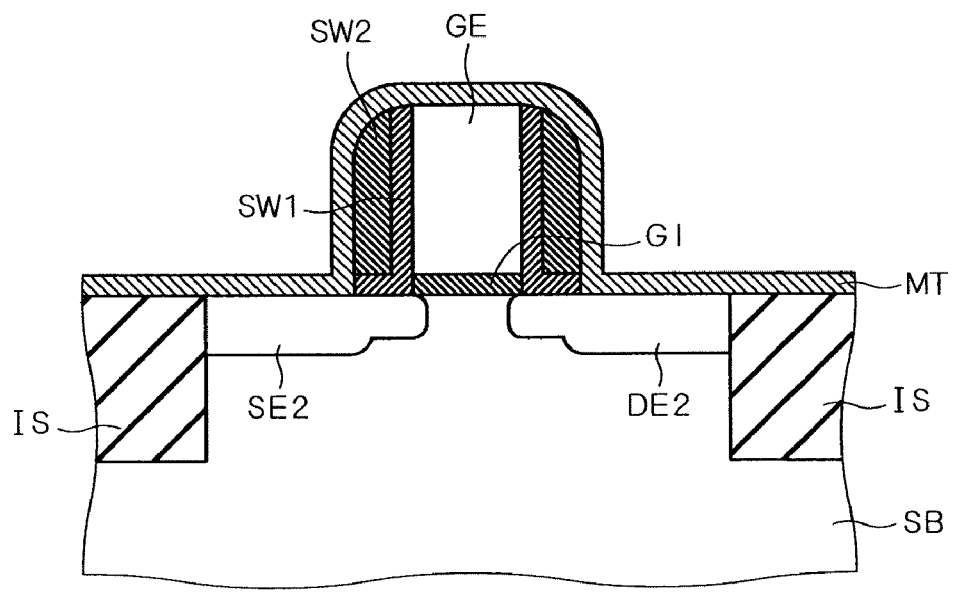
F I G . 7
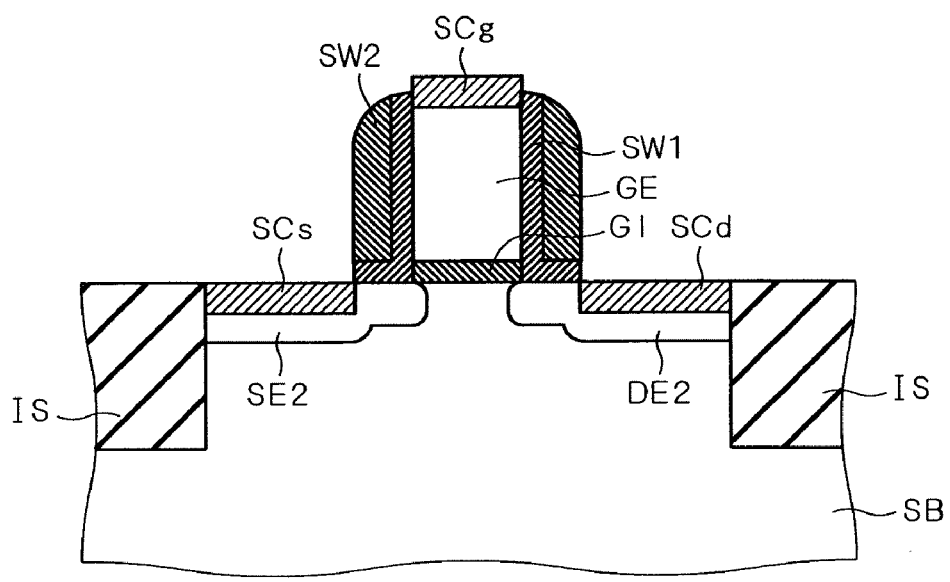

METHOD OF MANUFACTURING A SEMICONDUCTOR DEVICE

CROSS-REFERENCE TO RELATED APPLICATION

This application is a divisional of and claims the benefit of priority under 35 U.S.C. §120 from U.S. application Ser. No. 11/771,340, filed Jun. 29, 2007, and claims the benefit of priority under 35 U.S.C. §119 from Japanese patent application No. 2006-183133 filed on Jul. 3, 2006, the contents of both of which are hereby incorporated by reference into this application.

FIELD OF THE INVENTION

This invention relates to the semiconductor device provided with n channel MISFET (Metal Insulator Semiconductor Field Effect Transistor) comprising the silicide region of nickel or a nickel alloy, and a method of manufacturing the device.

DESCRIPTION OF THE BACKGROUND ART

For example, in a SoC (System on Chip) device etc., n channel MISFET by which the silicide region of nickel or a nickel alloy was formed in the gate, the source, and the drain by the self-align process (SAlicide: Self Aligned silicide) is adopted.

As information on prior art documents which forms a nickel silicide region in MISFET, some are following.

[Patent Reference 1] Japanese Unexamined Patent Publication No. 2005-150267

SUMMARY OF THE INVENTION

MISFET is formed in many cases on the main front surface of the (100) silicon substrate from which the plane direction of a main front surface constitutes a surface (100). In n channel MISFET, it is common to arrange so that the direction (namely, channel length direction) which connects a source and a drain may become parallel to crystal orientation <110>. In n channel MISFET, it is because mobility will improve compared with the case of being parallel to other crystal orientation when a channel length direction is parallel to crystal orientation <110>.

However, it became clear by investigation of present application inventors that in n channel MISFET with a channel length direction parallel to crystal orientation <110>, when the silicide region of nickel or a nickel alloy is formed in a source and a drain, it will be easy to increase OFF leakage current, and the yield will fall. According to this investigation, it is considered to be the cause of an increase of OFF leakage current that the thermally unstable silicide region of nickel or a nickel alloy grows unusually along crystal orientation <110> by heat treatment, and erodes even to a channel region across the region of a source and a drain.

This invention was made in view of the above-mentioned situation, and even if it is a case where the silicide region of nickel or a nickel alloy is formed in the source and drain of n channel MISFET, it aims at offering the semiconductor device in which OFF leakage current does not increase easily.

Invention according to a first embodiment is a semiconductor device, including: a semiconductor substrate which has a main front surface whose plane direction is a surface (100); and n channel MISFET (Metal Insulator Semiconductor Field Effect Transistor) formed over the main front surface; wherein the n channel MISFET includes a source and a drain which were formed in the main front surface, and a silicide region including nickel or nickel alloy formed in at least one front surface of the source and the drain; and a channel length direction of the n channel MISFET has been arranged so that it may become parallel to a crystal orientation <100> of the semiconductor substrate.

Invention according to a second embodiment is a semiconductor device, including: a semiconductor substrate which has a main front surface whose plane direction is a surface (100); n channel MISFET (Metal Insulator Semiconductor Field Effect Transistor) formed over the main front surface; and an element isolation film which is in the main front surface and was formed in a region around the n channel MISFET; wherein the n channel MISFET includes a source and a drain which were formed in the main front surface, and a silicide region including nickel or nickel alloy formed in at least one front surface of the source and the drain; a front surface of a portion which adjoins the source and the drain in a channel width direction of the n channel MISFET among the element isolation films falls rather than a front surface of the source and the drain; and a channel length direction of the n channel MISFET has been arranged so that it may become parallel to a crystal orientation <100> of the semiconductor substrate.

Invention according to a third embodiment is a semiconductor device, including: a semiconductor substrate which has a main front surface whose plane direction is a surface (100); and a first and a second n channel MISFET (Metal Insulator Semiconductor Field Effect Transistor) which were formed over the main front surface; wherein the first n channel MISFET includes a first source and a first drain which were formed in the main front surface, and a first silicide region which was formed in at least one front surface of the first source and the first drain and including nickel; the second n channel MISFET includes a second source and a second drain which were formed in the main front surface, and a second silicide region which was formed in at least one front surface of the second source and the second drain and including nickel; each channel length direction of the first and the second n channel MISFET is arranged so that it may become parallel to a crystal orientation <100> of the semiconductor substrate; the first silicide region is $NiSi_2$; and the second silicide region is NiSi.

According to the first embodiment, the channel length direction of n channel MISFET is arranged so that it may become parallel to the crystal orientation <100> of a semiconductor substrate. Since it is hard to extend the silicide region of nickel or a nickel alloy in the direction of crystal orientation <100>, even if it is a case where the silicide region of nickel or a nickel alloy is formed in the source and drain of n channel MISFET, the semiconductor device in which OFF leakage current does not increase easily is obtained.

According to the second embodiment, the channel length direction of n channel MISFET is arranged so that it may become parallel to the crystal orientation <100> of a semiconductor substrate. Since it is hard to extend the silicide region of nickel or a nickel alloy in the direction of crystal orientation <100>, even if it is a case where the silicide region of nickel or a nickel alloy is formed in the source and drain of n channel MISFET, the semiconductor device in which OFF leakage current does not increase easily is obtained. When the front surface of the portion which adjoins a source and a drain in the channel width direction of n channel MISFET among element isolation films has fallen rather than the front surface of the source and the drain especially, in conventional <110> channel MISFET, although it is easy to extend the silicide region of nickel or the nickel alloy on a source and a drain in the direction of crystal orientation <110>, according to the present invention, the increase in OFF leakage current can be suppressed effectively.

According to the third embodiment, the channel length direction of the first and second n channel MISFET is arranged so that it may become parallel to the crystal orientation <100> of a semiconductor substrate. In the direction of crystal orientation <100>, since it is hard to extend a nickel silicide region, even if it is a case where a nickel silicide region is formed in the source and drain of the first and second n channel MISFET, the semiconductor device in which OFF leakage current does not increase easily is obtained. A first silicide region is $NiSi_2$ and a second silicide region is NiSi. Since it is hard to extend $NiSi_2$ in the direction of crystal orientation <100>, it can use first n channel MISFET as an element for memories, for example, and can suppress the increase in OFF leakage current. On the other hand, rather than $NiSi_2$, since NiSi is low resistance, it can use second n channel MISFET as an element for logic, for example, and can aim at speeding up of a logical circuit.

Further according to the present invention, there is provided a method of manufacturing a semiconductor device, including the steps of preparing a silicon substrate which has a main surface whose plane direction is a surface (100); forming an n channel MISFET (Metal Insulator Semiconductor Field Effect Transistor) which has a gate electrode, a source region, a drain region and a channel whose channel length direction is parallel to a crystal orientation <100> of the silicon substrate; and forming NiSi over the gate electrode and $NiSi_2$ over the source region and the drain region at the same steps.

Still further according to the present invention, there is provided a method of manufacturing a semiconductor device, including the steps of preparing a silicon substrate which has a main surface whose plane direction is a surface (100); forming an n channel MISFET (Metal Insulator Semiconductor Field Effect Transistor) which has a gate electrode, a source region, a drain region and a channel whose channel length direction is parallel to a crystal orientation <100> of the silicon substrate; forming a Ni film over the n channel MISFET; performing first thermal annealing to react the Ni film with the gate electrode, the source region and the drain region; removing an unreacted Ni film; and performing second thermal annealing to form NiSi over the gate electrode and $NiSi_2$ over the source region and the drain region.

BRIEF DESCRIPTION OF THE DRAWINGS

FIGS. 3 to 7 are drawings showing each step of the manufacturing method of the semiconductor device concerning Embodiment 1;

DETAILED DESCRIPTION OF THE PREFERRED EMBODIMENTS

Embodiment 1

This embodiment is a semiconductor device arranged so that the channel length direction of n channel MISFET by which the nickel silicide region was formed on the source and the drain may become parallel to the crystal orientation <100> of a semiconductor substrate.

Figure 1:
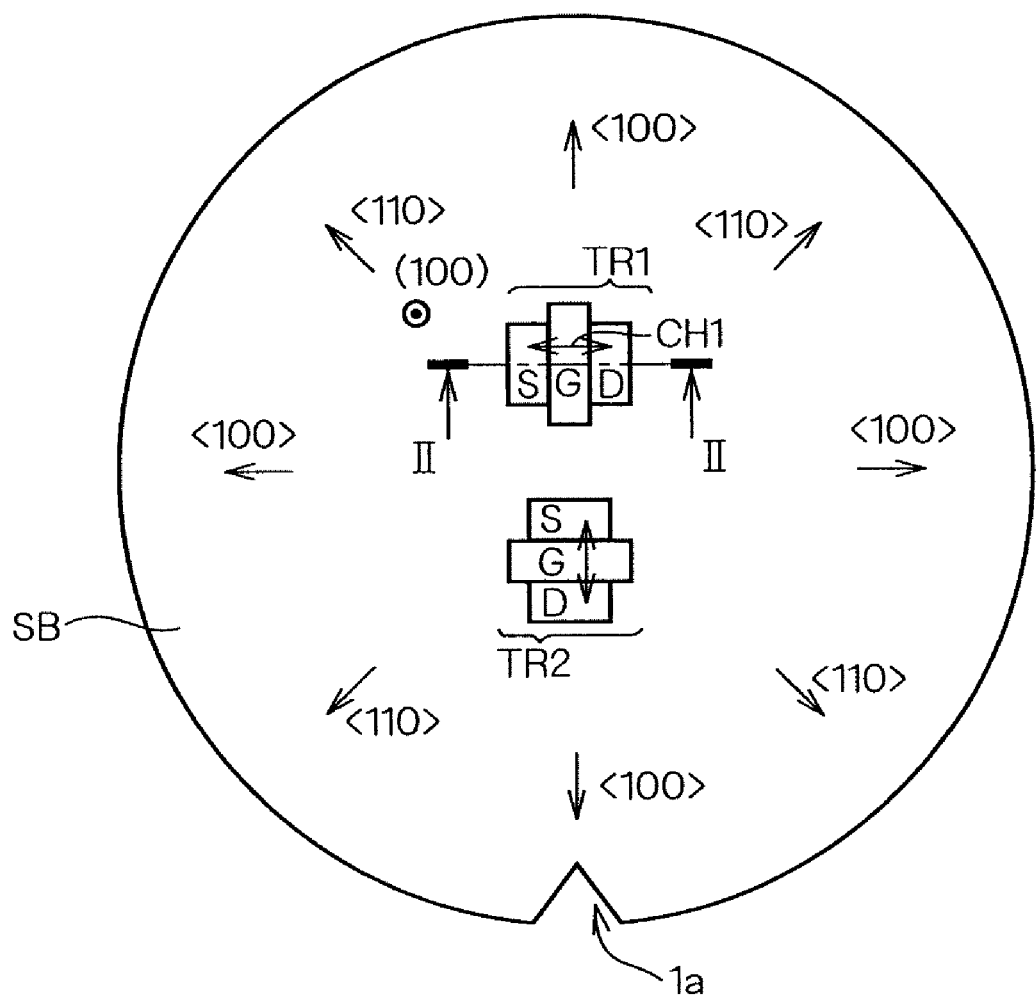
FIG. 1 is a top view showing the semiconductor substrate in which the semiconductor device concerning Embodiment 1 was formed.

FIG. 1 is a drawing showing semiconductor substrate SB in which the semiconductor device concerning this embodiment was formed. Semiconductor substrate SB is a silicon substrate which comprises a single-crystal wafer of silicon. In FIG. 1, as the symbol of a double circle shows, this semiconductor substrate SB has a main front surface whose plane direction is a (100) surface. FIG. 1 shows the crystal orientation in each part with a crest parenthesis, triple digits, and an arrow. That is, the crystal orientation <100> and <110> within a wafer surface are adjusted and displayed.

On the main front surface of semiconductor substrate SB, the semiconductor device comprising the device of n channel transistor TR1 and TR2, etc. which are n channel MIS (for example, MOS) FET (Metal Insulator (for example, Oxide) Semiconductor Field Effect Transistor) and the wiring which connects between these devices is formed. Notch 1a is formed in the direction of crystal orientation <100> at semiconductor substrate SB.

In this embodiment, channel length direction CH1 between the source/drains of n channel transistor TR1 and TR2 is arranged so that each may become parallel to the crystal orientation within the main surface of semiconductor substrate SB<100>. Symbol S shown in n channel transistor TR1 and TR2 shows a source, symbol D shows a drain and symbol G shows a gate.

Figure 2:
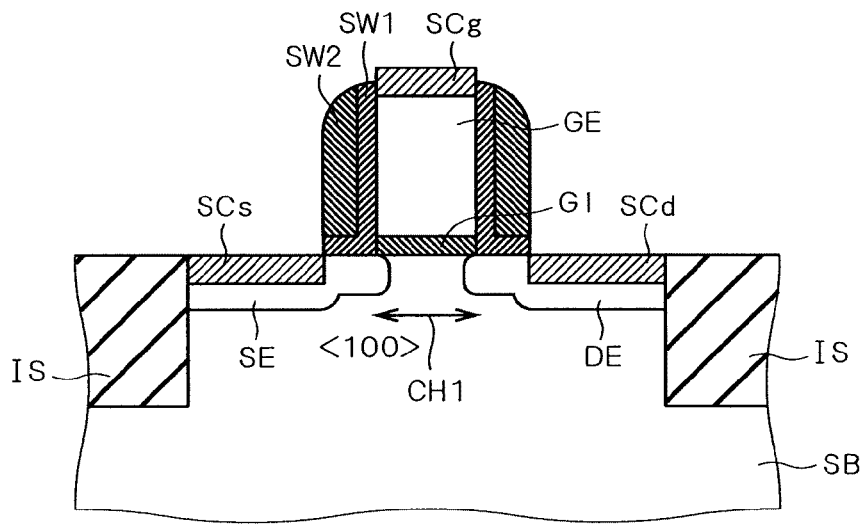
FIG. 2 is a cross-sectional view showing the semiconductor device concerning Embodiment 1.

FIG. 2 is a drawing showing the section in cutting plane line II-II in FIG. 1, and is a cross-sectional view showing the semiconductor device concerning this embodiment. As shown in FIG. 2, n channel transistor TR1 includes the laminated structure of gate insulating film (for example, silicon oxide film) G1 and gate electrode (for example, polysilicon film) GE formed on the main front surface of semiconductor substrate SB, and source SE and drain DE formed in the main front surface of semiconductor substrate SB. N channel transistor TR1 includes further silicide regions SCs and SCd which were formed in the front surface of a source and a drain and including nickel, and gate silicide region SCg which was formed on the surface of the gate electrode and including nickel. Gate silicide region SCg is NiSi and silicide regions SCs and SCd are $NiSi_2$.

Facing the side surface of the laminated structure of gate insulating film G1 and gate electrode GE, and a part of front surface of source SE and drain DE, first sidewall insulating film SW1, such as a TEOS (Tetra Ethyl Oxy Silane) oxide film, is formed, respectively. Facing the side surface of the laminated structure of gate insulating film G1 and gate electrode GE, and a part of front surface of source SE and drain DE via first sidewall insulating film SW1, second sidewall insulating film SW2, such as a silicon nitride film, is formed, respectively.

Element isolation film IS, such as a silicon oxide film, is formed in the region which is in the main front surface of semiconductor substrate SB and which is around n channel transistor TR1, i.e., the outside of source SE and drain DE.

FIG. 3-FIG. 7 are the drawings showing each step of the manufacturing method of the semiconductor device concerning an embodiment of the invention. Hereafter, the manufacturing method of the semiconductor device related to an embodiment of the invention using each drawing is explained.

Figure 3:
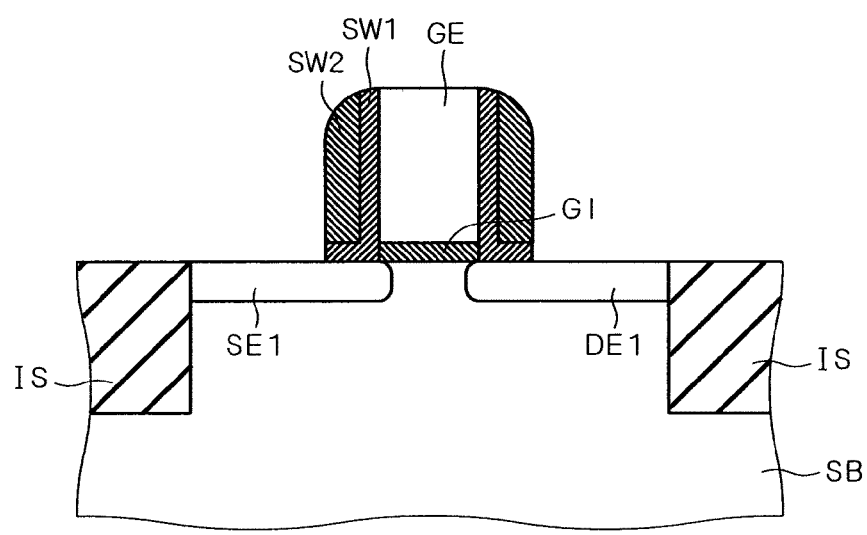

First, as shown in FIG. 3, on semiconductor substrate SB, n channel MISFET including the laminated structure of gate insulating film G1 and gate electrode GE, first sidewall insulating film SW1, second sidewall insulating film SW2, LDD (Lightly Doped Drain) region SEI of a source, and LDD region DE1 of a drain are formed using photolithography technology and etching technology, ion implantation technology, etc.

Figure 4:
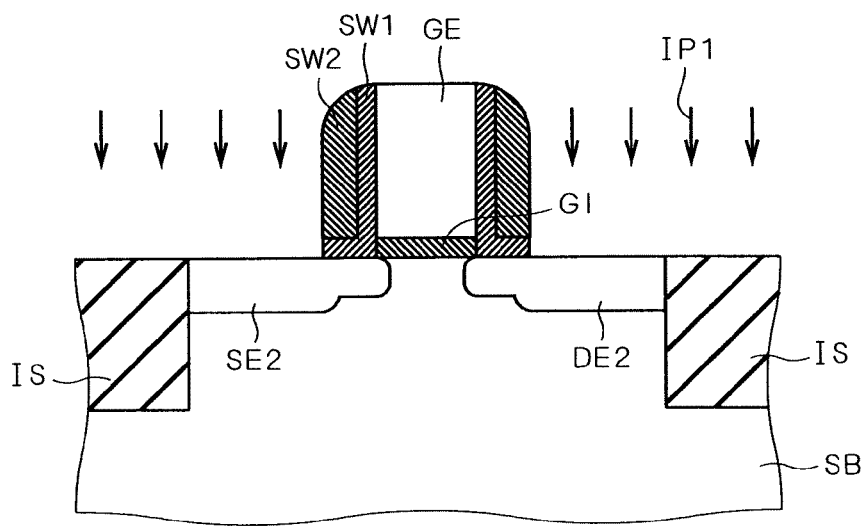

Next, as shown in FIG. 4, ion implantation IPI is performed and formation of source SE2 and drain DE2 is performed. Since source SE2 and drain DE2 are formed as n type source region and an n type drain region, what is necessary is, for example, to form them by implanting As (arsenic) ion into semiconductor substrate SB under the conditions of 5-20 [keV], and $1 \times 10^{15}$ to $1 \times 10^{16}$ [$cm^{-2}$]] or to form them by implanting P (phosphorus) ion into semiconductor substrate SB under the conditions of 5-10 [keV], and $1 \times 10^{14}$ to $1 \times 10^{15}$ [$cm^{-2}$]. And spike annealing (extremely short-time rapid heating processing is meant, and it is made to go up to 900° C.~1000° C.) is given to source SE2 and drain DE2.

Figure 5:
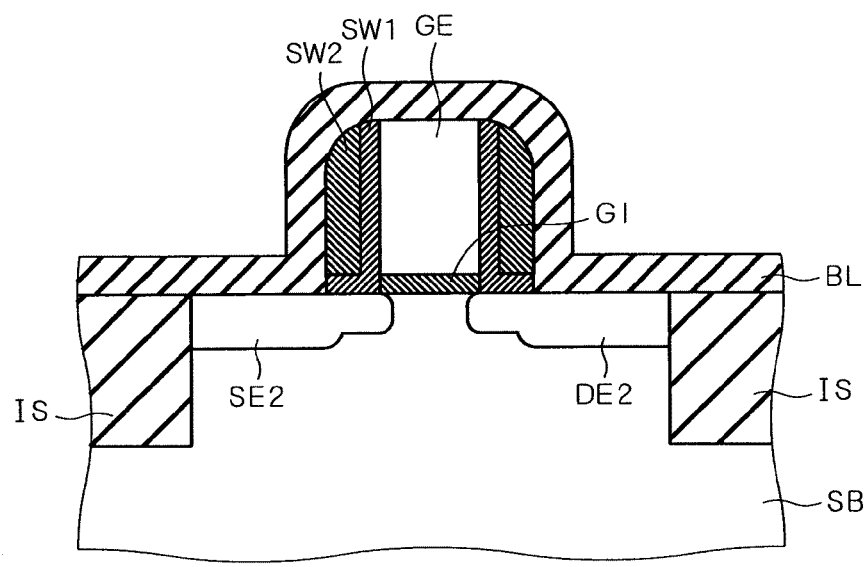

Next, as shown in FIG. 5, silicidation preventing film BL for covering the portion which should prevent a silicidation among semiconductor substrates SB is formed. What is necessary is just to adopt the USG (Undoped Silicate Glass) film formed with 400 forming temperature by the CVD (Chemical Vapor Deposition) method as this silicidation preventing film BL.

And anisotropic etching (dry etching) is selectively performed to silicidation preventing film BL using photolithography technology and etching technology. Silicidation preventing film BL is left into the portions (for example, portion not to silicide among the contact regions of a wiring etc.) which should prevent a silicidation (not shown).

Next, cleaning of the portion which performs a silicidation for removing the silicon oxide film generated on the semiconductor substrate SB front surface or the gate electrode GE front surface is performed. What is necessary is just to perform cleaning using fluoric acid in this cleaning process in addition to RCA cleaning. It may be pre-cleaning which, in addition to this, uses the equipment with which pre-cleaning (chemical dry cleaning) equipment and a sputtering system were unified.

Next, on the front surface of semiconductor substrate SB, and left silicidation preventing film BL (not shown), by a sputtering technique etc., Ni film MT is formed, as shown in FIG. 6. Formation thickness of Ni film MT should just be set, for example to 8.0-12.5 [nm].

And first RTA (Rapid Thermal Annealing) is performed. Lamp annealing etc. performs this first RTA under the conditions of annealing temperature 300° C.~350° C., 30 to 60 seconds, and $N_2$ atmosphere. Ni film MT, and a gate electrode GE front surface, and the front surface of source SE2 and drain DE2 are made to react. $NiSi_2$ is formed in a gate electrode GE front surface, and the front surface of source SE2 and drain DE2 at this time.

Next, unreacted Ni film MT is removed. What is necessary is just to perform a removing processing by making semiconductor substrate SB immersed in the mixed solution of sulfuric acid and a hydrogen peroxide solution for 30 to 60 minutes.

Next, the second RTA is performed. Lamp annealing etc. performs this second RTA under the conditions of annealing temperature 500° C.~600° C., 30 to 60 seconds, and $N_2$ atmosphere. Ni film MT, and a gate electrode GE front surface, and the front surface of source SE2 and drain DE2 are made to react again. At this time, NiSi is formed in a gate electrode GE front surface, and, on the other hand, $NiSi_2$ is formed in the front surface of source SE2 and drain DE2.

On the annealing conditions of the second RTA, NiSi should usually be formed. However, when it becomes a fine region in a plan view of source SE2 and drain DE2 to which one side becomes about 100 nm or less, source SE2 and drain DE2 will receive stress from surrounding element isolation film IS, and $NiSi_2$ will be formed under these conditions of the influence.

Although not illustrated, p channel MISFET may be formed on the main front surface of semiconductor substrate SB. In forming such p channel MISFET, except that the conductivity type of an LDD region or gate electrode GE is a p type, it forms the same structure as FIG. 3. Then, what is necessary is just to form the p type source region and a p type drain region by implanting B (boron) ion into semiconductor substrate SB under the conditions of 0.5-2 [keY], and $1 \times 10^{15}$ to $1 \times 10^{16}$ [$cm^{-2}$], for example. And what is necessary is just to perform spike annealing, subsequent formation of silicidation preventing film BL, and subsequent silicidation processing with the forming step of n channel MISFET.

Hereby, a silicidation is performed to gate electrode GE and source SE2 and drain DE2 of n channel transistor TR1, or in addition to them, to the gate electrode, the source region, and the drain region of a p channel transistor, respectively. As shown in FIG. 7, gate silicide region SCg and silicide regions SCs and SCd are formed in each front surface of gate electrode GE and source SE2 and drain DE2, respectively.

Figure 8:
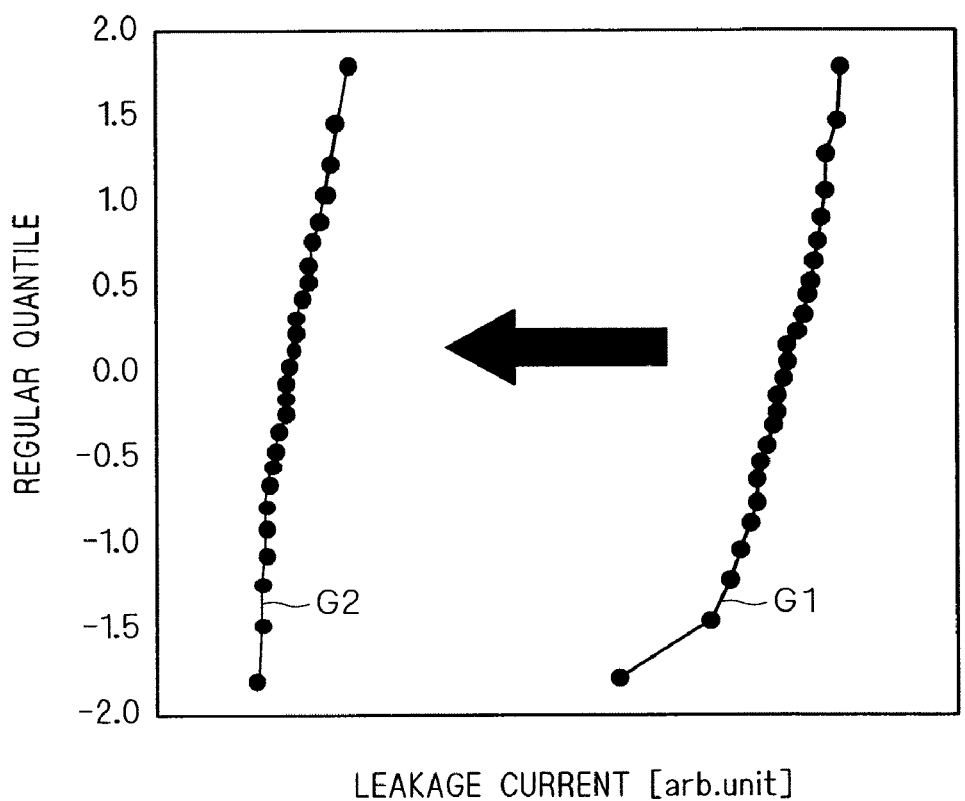
FIGS. 8 and 9 are drawings showing the effect of the semiconductor device concerning Embodiment 1.

FIG. 8 is the graph which shows the example of the result of having measured drain bodies-off leakage current (substrate leakage current) about n channel transistor TR1 concerning this embodiment which has arranged the channel length direction so that it may become parallel to the crystal orientation <100> of semiconductor substrate SB, and the conventional n channel transistor which has arranged the channel length direction so that it may become parallel to the crystal orientation <110> of semiconductor substrate SB.

In FIG. 8, a vertical axis shows the quantile (value "0" is a mode) in the normal distribution measuring result of all the n channel transistors, and the horizontal axis shows the substrate leakage current value (arbitrary unit). The measuring result of graph G1 is a thing of the conventional n channel transistor which has arranged the channel length direction so that it may become parallel to the crystal orientation <110> of semiconductor substrate SB. The measuring result of graph G2 is a thing of n channel transistor TR1 concerning this embodiment which has arranged the channel length direction so that it may become parallel to the crystal orientation <100> of semiconductor substrate SB.

As clearly from FIG. 8, in n channel transistor TR1 concerning this embodiment, the leakage current value is decreasing compared with a conventional n channel transistor. When inventors observe in detail, as the column of later <modification> may also describe minutely, it is considered to be the cause of this leakage current value reduction that it is hard to do abnormal growth of the nickel silicide region to the direction of crystal orientation <100>, i.e., the extending direction of channel length, and the stable nickel silicide region is obtained thermally. Therefore, the increase in OFF leakage current can be suppressed and yield lowering can be suppressed.

That is, according to the semiconductor device concerning this embodiment, the channel length direction of n channel MISFET is arranged so that it may become parallel to the crystal orientation <100> of semiconductor substrate SB. In the direction of crystal orientation <100>, since it is hard to extend a nickel silicide region, even if it is a case where nickel silicide regions SCs and SCd are formed in source SE and drain DE of n channel MISFET, the semiconductor device in which OFF leakage current does not increase easily is obtained.

In the above, the thing of the case that NiSi is formed in a gate electrode GE front surface and $NiSi_2$ is formed in the front surface of source SE2 and drain DE2 was shown as conditions for RTA of the first and the second time. However, NiSi may be formed in the both sides of a gate electrode GE front surface, and the front surface of source SE2 and drain DE2.

In this case, lamp annealing etc. performs first RTA under the conditions of annealing temperature 250° C.~350° C., 30 to 60 seconds, and $N_2$ atmosphere (at this time, $NiSi_2$ is first formed in a gate electrode GE front surface, and the front surface of source SE2 and drain DE2). Then, unreacted Ni film MT is removed by making semiconductor substrate SB immersed in the mixed solution of sulfuric acid and a hydrogen peroxide solution for 30 to 60 minutes. Lamp annealing etc. performs the second RTA under the conditions of annealing temperature 350° C.~450° C., 30 to 60 seconds, and $N_2$ atmosphere. Then, NiSi is formed in the both sides of a gate electrode GE front surface, and the front surface of source SE2 and drain DE2.

When inventors observe in detail, since $NiSi_2$ phase is a stable crystal phase thermally when $NiSi_2$ is formed in the front surface of source SE2 and drain DE2, it is harder to do abnormal growth of the nickel silicide region than the case where NiSi is formed in the front surface of source SE2 and drain DE2. When NiSi is formed on the other hand as a silicide region including nickel, it becomes low resistance rather than the case where $NiSi_2$ is formed.

Figure 9:
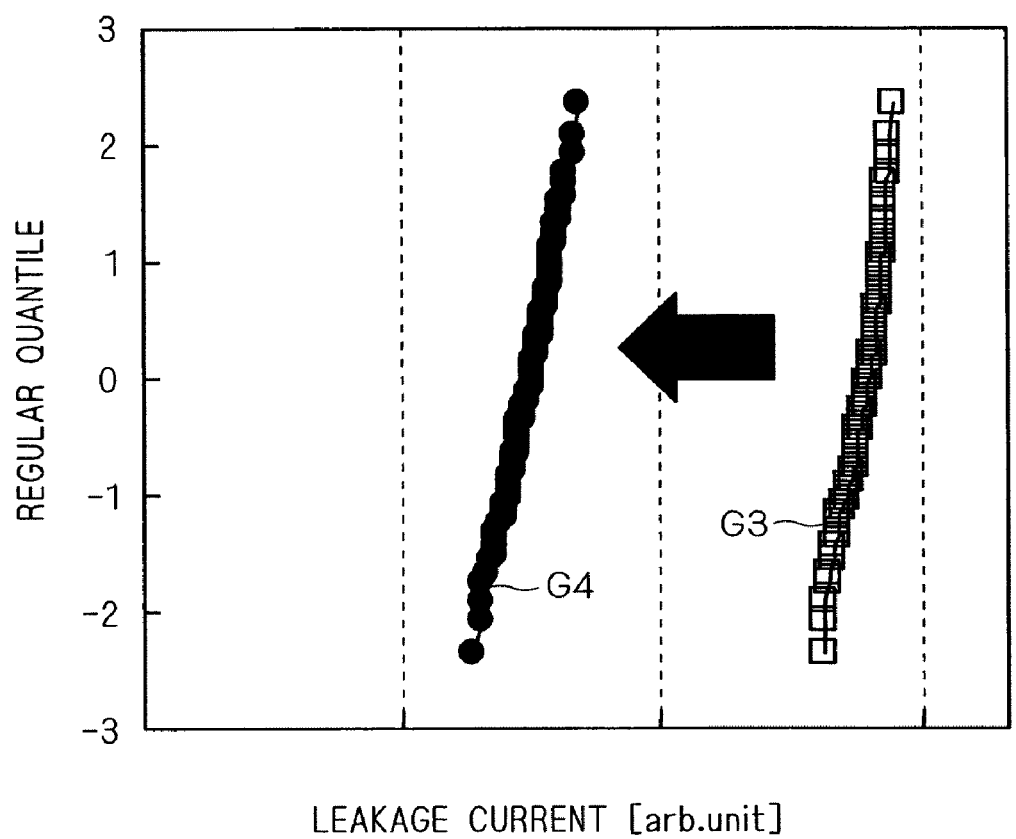

FIG. 9 is the graph which shows the example of the result of having measured drain bodies-off leakage current (substrate leakage current) about n channel transistor TR1 concerning this embodiment which has arranged the channel length direction so that it may become parallel to the crystal orientation <100> of semiconductor substrate SB, and formed NiSi in the front surface of source SE2 and drain DE2, and n channel transistor TR1 concerning this embodiment which has arranged the channel length direction so that it may become parallel to the crystal orientation <100> of semiconductor substrate SB, and formed $NiSi_2$ in the front surface of source SE2 and drain DE2.

In FIG. 9, a vertical axis shows the quantile (value "0" is a mode) in the normal distribution measuring result of all the n channel transistors, and the horizontal axis shows the substrate leakage current value (arbitrary unit). The measuring result of graph G3 is a thing of the n channel transistor in which NiSi was formed on the front surface of source SE2 and drain DE2. The measuring result of graph G4 is a thing of the n channel transistor in which $NiSi_2$ was formed on the front surface of source SE2 and drain DE2.

As clearly from FIG. 9, with the n channel transistor in which $NiSi_2$ was formed on the front surface of source SE2 and drain DE2, the leakage current value is decreasing compared with the n channel transistor in which NiSi was formed on the front surface of source SE2 and drain DE2. Therefore, the side in the case of forming $NiSi_2$ in the front surface of source SE2 and drain DE2 can suppress the increase in OFF leakage current more, and can suppress yield lowering.

That is, when NiSi is formed in the both sides of a gate electrode GE front surface, and the front surface of source SE2 and drain DE2, resistance reduction can be aimed at in each nickel silicide region. On the other hand, when $NiSi_2$ is formed in the front surface of source SE2 and drain DE2, it will be hard to do abnormal growth of the nickel silicide region.

Therefore, according to the semiconductor device concerning this embodiment, when silicide regions SCs and SCd are $NiSi_2$, it is harder to extend nickel silicide regions SCs and SCd in the direction of crystal orientation <100> than the case where silicide regions SCs and SCd are NiSi.

According to the semiconductor device concerning this embodiment, gate silicide region SCg is NiSi. When gate silicide region SCg is NiSi, it is low resistance from the case where gate silicide region SCg is $NiSi_2$.

In above-mentioned FIG. 1, semiconductor substrate SB by which notch 1a was formed in the direction of crystal orientation <100> was prepared. The channel length direction of n channel transistor TR1 and TR2 was arranged so that it might become parallel or vertical to the direction which connects notch 1a and a substrate center. However, in order to make the channel length direction of n channel transistor TR1 and TR2 parallel to the crystal orientation <100> of semiconductor substrate SB, there is not necessarily the need of adopting the method of FIG. 1.

Figure 10:
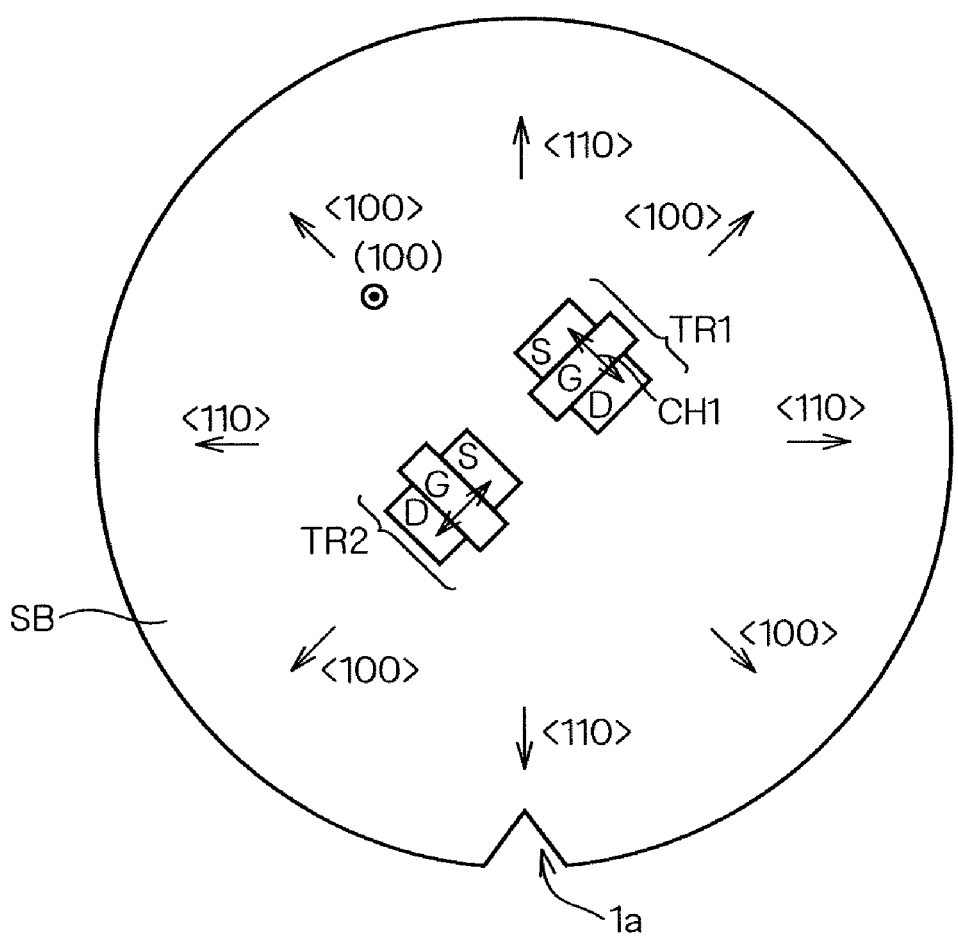
FIG. 10 is a top view showing other semiconductor substrates In which the semiconductor device concerning Embodiment 1 was formed.

For example, FIG. 10 is a top view showing other semiconductor substrates in which the semiconductor device concerning this embodiment was formed. In FIG. 10, semiconductor substrate SB which has a main front surface whose plane direction is a (100) surface is adopted like the case of FIG. 1. However, in this substrate, it is not in the direction of crystal orientation <100>, and notch 1a is formed in the direction of crystal orientation <110>. In this case, what is necessary is just to form n channel transistors TR1 and TR2 for semiconductor substrate SB, after rotating 45 degrees or 135 degrees. Then, the channel length direction of n channel transistor TR1 and TR2 can be made parallel to the crystal orientation <100> of semiconductor substrate SB.

In addition, crystal growth of the region which has different crystal orientation from the crystal orientation of a main front surface, for example is done partially on the main front surface of semiconductor substrate SE. The policy which makes the channel length direction of n channel transistors TR1 and TR2 parallel to the crystal orientation <100> of semiconductor substrate SB may be taken by forming n channel transistors TR1 and TR2 on the crystal growth region.

Embodiment 2

This embodiment is a modification of the semiconductor device concerning Embodiment 1. Silicon and germanium are included at least near the main front surface in which source SE and drain DE were formed among semiconductor substrates SB in Embodiment 1.

Figure 11:
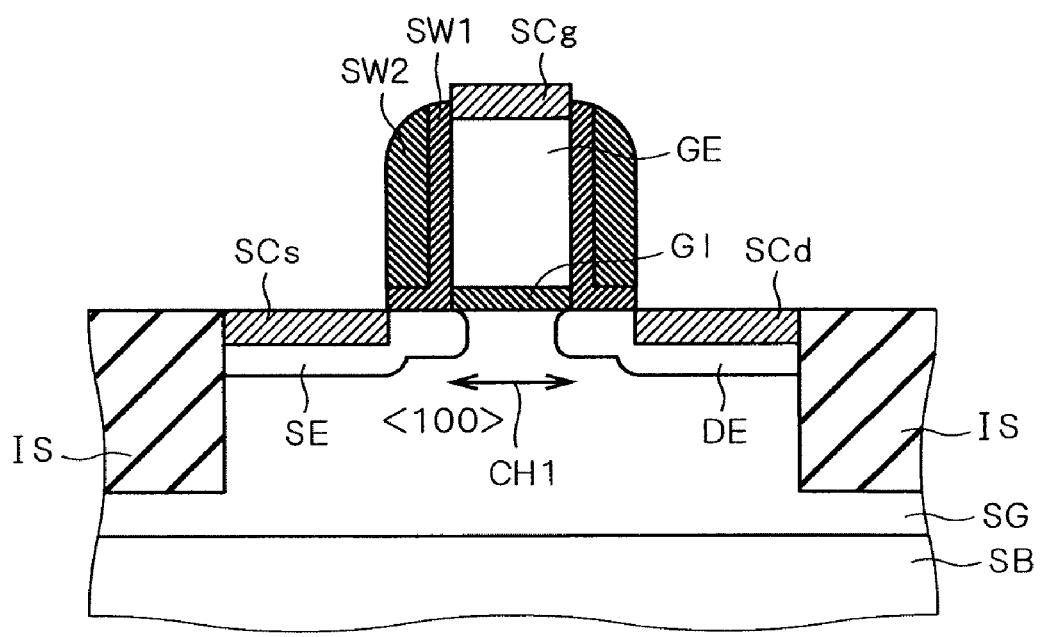
FIG. 11 is a cross-sectional view showing the semiconductor device concerning Embodiment 2.

FIG. 11 is a cross-sectional view showing the semiconductor device concerning this embodiment. In FIG. 11, silicon germanium (SiGe) layer SG is formed near the main front surface in semiconductor substrates SB. Source SE and drain DE are formed in silicon germanium layer SG. Device structure is the same as FIG. 2 except those points.

Silicon germanium layer SG is easy to generate strain compared with a silicon layer. Therefore, in addition to the stress from surrounding element isolation film IS, source SE2 and drain DE2 also tend to receive the influence of strain from silicon germanium layer SG in the case of annealing of the second RTA in above-mentioned Embodiment 1. Therefore, the nickel silicide region on source SE2 and drain DE2 is easily set to $NiSi_2$.

About other points, since it is the same as that of the semiconductor device concerning Embodiment 1, explanation is omitted.

According to the semiconductor device concerning this embodiment, at least the neighborhood of a main front surface in which source SE and drain DE were formed in semiconductor substrates SB includes silicon and germanium. In semiconductor substrate SB including silicon and germanium, nickel silicide regions SCs and SCd on source SE and drain DE are easily set to $NiSi_2$.

For example, on the main front surface of semiconductor substrate SB, silicon germanium layer SG may be formed by growing a SiGe layer epitaxially partially. Or it may be formed by implanting germanium ion at least in a part of main front surface of a silicon substrate.

Embodiment 3

This embodiment is a modification of the semiconductor device concerning Embodiment 1. N channel transistor TR1 in Embodiment 1 is used as an element for memory areas, and n channel transistor TR2 is used as an element for example, logic regions.

Figure 12:
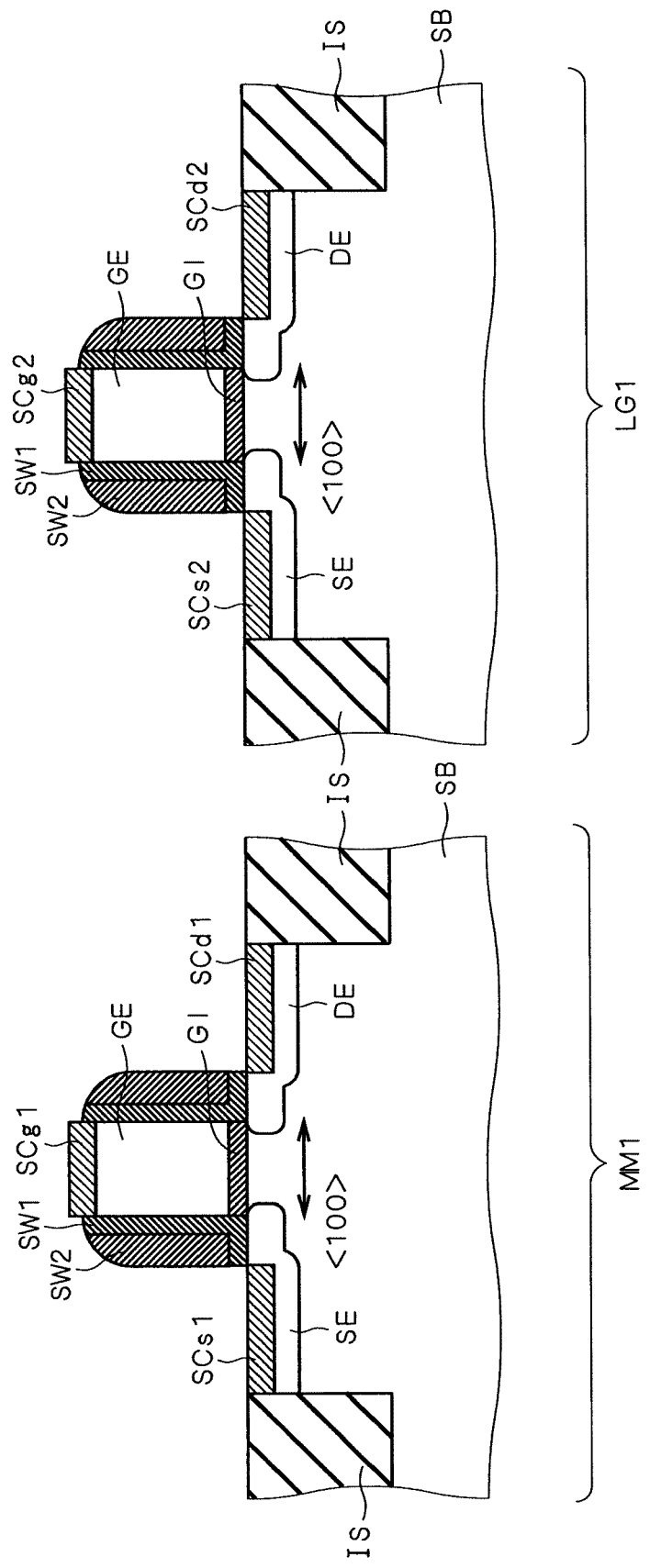
FIG. 12 is a drawing showing the semiconductor device concerning Embodiment 3.

FIG. 12 is a cross-sectional view showing the semiconductor device concerning this embodiment. In FIG. 12, two structures of the same n channel transistor as FIG. 2 are located in a line, and are shown. The transistor formed in region MM1 in FIG. 12 is n channel transistor TRI of FIG. 1, and is used as elements for memory areas, such as SRAM (Static Random Access Memory). The transistor formed in region LG1 in FIG. 12 is n channel transistor TR2 of FIG. 1, and is used as elements for logic regions, such as DSP (Digital Signal Processor).

N channel transistor TRI formed in region MM1 has the source SE, drain DE, gate electrode GE, gate insulating film G1, first sidewall insulating film SW1 and second sidewall insulating film SW2 which are the same as n channel transistor TRI formed on semiconductor substrate SB in Embodiment 1. It also has silicide regions SCsI and SCd1 including nickel of a source SE and drain DE front surface, and gate silicide region SCg1 including nickel of a gate electrode GE front surface.

Gate silicide region SCgI is NiSi and silicide regions SCs1 and SCd1 are $NiSi_2$.

N channel transistor TR2 formed in region LG1 has source SE, drain DE, gate electrode GE, gate insulating film G1, first sidewall insulating film SW1 and second sidewall insulating film SW2 which are the same as n channel transistor TR2 formed on semiconductor substrate SB in Embodiment 1. It also has silicide regions SCs2 and SCd2 including nickel of a source SE and drain DE front surface, and gate silicide region SCg2 including nickel of a gate electrode GE front surface.

Gate silicide region SCg2 is NiSi and silicide regions SCs2 and SCd2 are NiSi(s).

Element isolation film IS, such as a silicon oxide film, is formed in the region which is in the main front surface of semiconductor substrate SB and which is around n channel transistor TRI and TR2, i.e., the outside of source SE and drain DE of each transistor.

According to the semiconductor device concerning this embodiment, like the case of Embodiment 1, the channel length direction of n channel transistors TRI and TR2 is arranged so that it may become parallel to the crystal orientation <100> of semiconductor substrate SE. In the direction of crystal orientation <100>, since it is hard to extend a nickel silicide region, even if it is a case where a nickel silicide region is formed in source SE and drain DE of n channel transistors TRI and TR2, the semiconductor device in which OFF leakage current does not increase easily is obtained. Silicide regions SCs1 and SCd1 are $NiSi_2$ and silicide regions SCs2 and SCd2 are NiSi(s). Since it is hard to extend $NiSi_2$ in the direction of crystal orientation <100>, it can use n channel transistor TRI as an element for memories, and can suppress the increase in OFF leakage current. On the other hand, rather than $NiSi_2$, since NiSi is low resistance, it can use n channel transistor TR2 as an element for logic, and can aim at speeding up of a logical circuit.

According to the semiconductor device concerning this embodiment, gate silicide regions SCg1 and SCg2 are NiSi(s). When gate silicide regions SCg1 and SCg2 are NiSi(s), it is low resistance from the case where gate silicide regions SCg1 and SCg2 are $NiSi_2$.

(Modification)

In above mentioned Embodiment 1 through 3, it explained by taking for an example the case where an ideal n channel transistor is formed, without touching the problem on a manufacturing process. However, when actually manufacturing an n channel transistor, various problems occur. The example is shown below.

Figure 13:
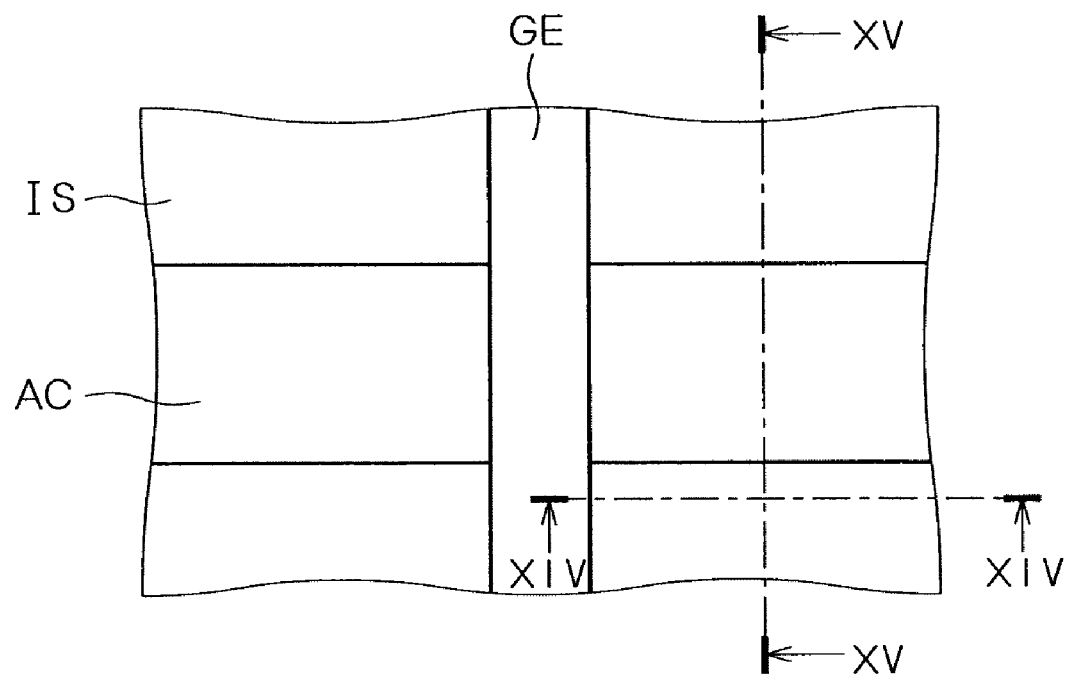
FIG. 13 is a top view when an n channel transistor is formed in the shape of an array.
Figure 14:
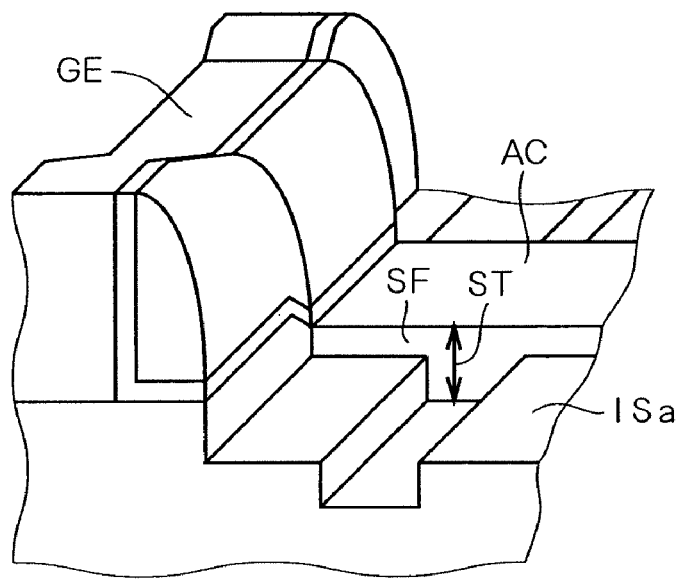
FIG. 14 is the perspective view seen from cutting plane line XIV-XIV in FIG. 13.
Figure 15:
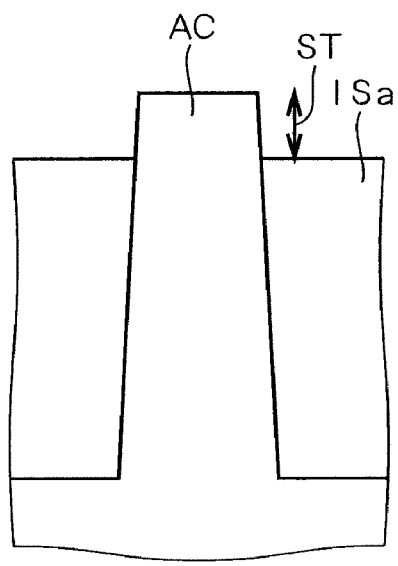
FIG. 15 is a cross-sectional view in cutting plane line XV-XV in FIG. 13.

Silicidation preventing film BL was shown in above-mentioned FIG. 5. When performing anisotropic etching selectively to this silicidation preventing film BL, it is easy to generate superfluous etching to element isolation film IS. The side surface of source SE and drain DE may be exposed. FIG. 13-FIG. 15 are the drawings explaining this, and FIG. 13 shows a top view when the n channel transistor concerning Embodiment 1 is formed in the shape of an array. FIG. 14 shows the perspective view seen from cutting plane line XIV-XIV in FIG. 13, and FIG. 15 shows the cross-sectional view in cutting plane line XV-XV in FIG. 13. In each drawing, region AC has pointed out the active region in which source SE and drain DE are formed.

It turns out that the front surface of portion ISa which adjoins active region AC in which source SE and drain DE are formed in the channel width direction of n channel MISFET of element isolation film IS which is in the main front surface of semiconductor substrate SB, and was formed in the region around n channel MISFET as shown in FIG. 14 and FIG. 15, has fallen rather than the front surface of active region AC (namely, source SE and drain DE). And in the central part, level difference ST from an active region AC front surface is large especially among element isolation films ISa.

Present application inventors have found out that the generation of depression of element isolation film ISa, i.e., the generation of level difference ST, originates in superfluous etching to element isolation film IS in the case of the selective anisotropic etching to above-mentioned silicidation preventing film BL.

Figure 16:
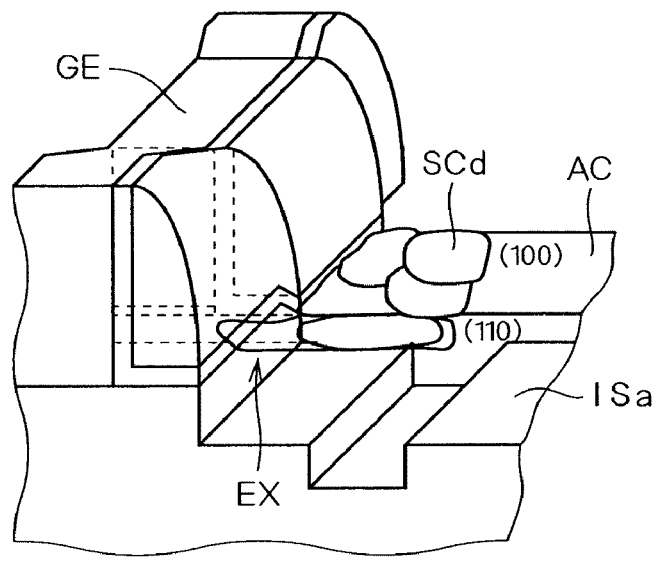
FIG. 16 is a drawing explaining the case where a silicide region extends to a channel length direction, and a diving portion occurs.

When the generation of depression of this element isolation film ISa occurs, as shown in FIG. 14, side surface SF of active region AC in which source SE and drain DE are formed will be exposed. And when side surface SF is exposed, near side surface SF will be silicided. In the conventional n channel transistor which has arranged the channel length direction so that it may become parallel to the crystal orientation <110> of semiconductor substrate SB, as shown in FIG. 16, the plane direction of side surface SF is set to (110). The silicide region formed in side surface SF among silicide regions SCd extends to a channel length direction, and it is easy to generate diving portion EX.

Figure 17:
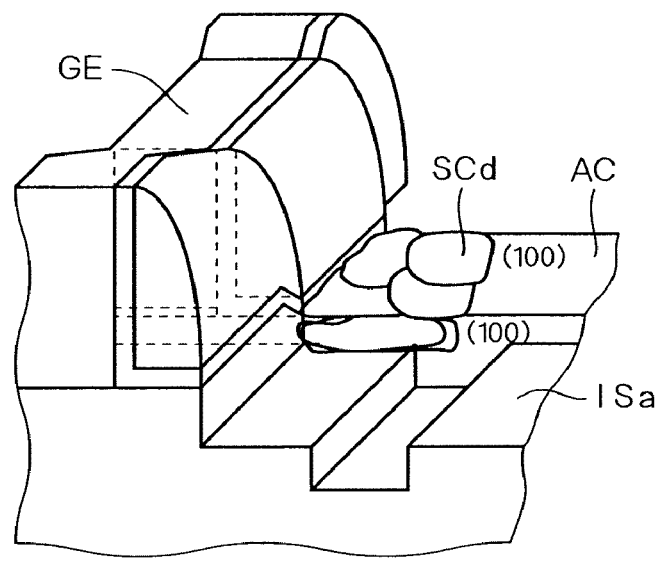
FIG. 17 is a drawing showing the effect of the present invention.

On the other hand, in the n channel transistor of the present invention which arranges a channel length direction so that it may become parallel to the crystal orientation <100> of semiconductor substrate SB, as shown in FIG. 17, the plane direction of side surface SF is set to (100). The extension to the channel length direction of the silicide region formed in side surface SF among silicide regions SCd is suppressed, and it is hard to generate a diving portion.

Figure 18:
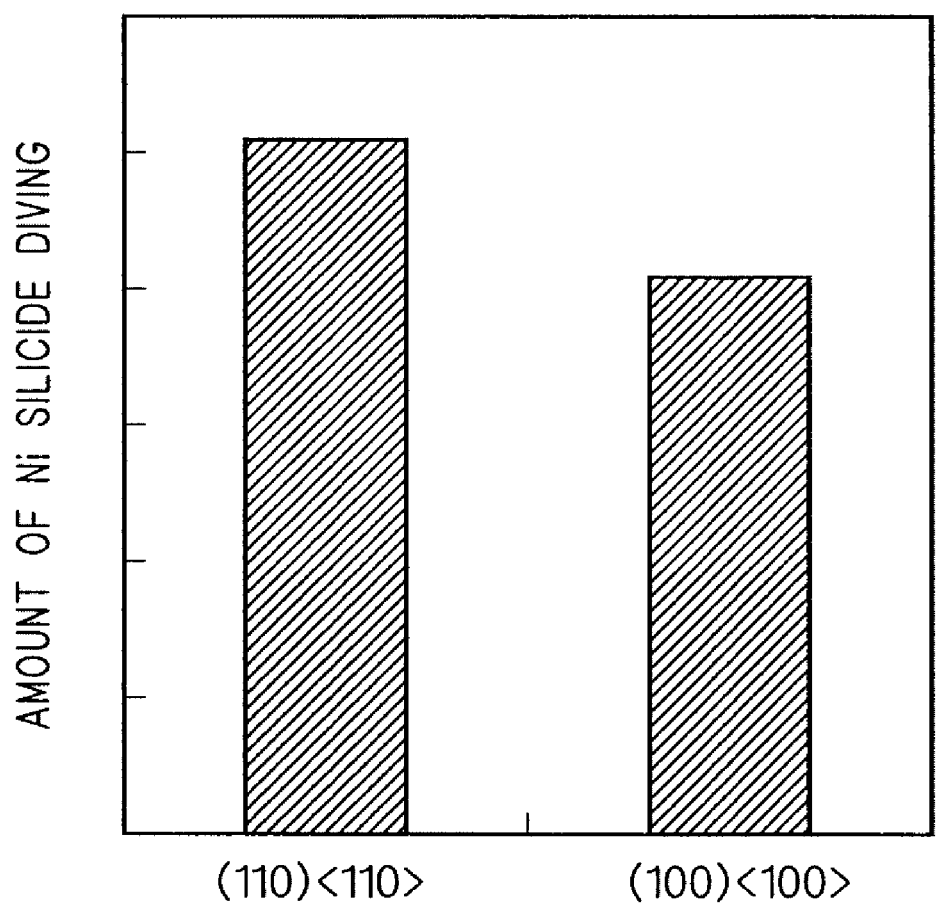
FIG. 18 is the graph which compared the amount of diving of the nickel silicide region to the direction of the crystal orientation <110> of a substrate (110), and the amount of diving of the nickel silicide region to the direction of the crystal orientation <100> of a substrate (100).

FIG. 18 is the graph which present application inventors got from various experiments and which compared the amount of diving of the nickel silicide region to the direction of the crystal orientation <110> of a substrate (110), and the amount of diving of the nickel silicide region to the direction of the crystal orientation <100> of a substrate (100). There are few amounts of diving of the nickel silicide region to the direction of the crystal orientation <100> of a substrate (100) than the amount of diving of the nickel silicide region to the direction of the crystal orientation <110> of a substrate (110) as FIG. 18 shows.

Namely, even if it is a case where the generation of depression of the above element isolation films ISa occurs, when the channel length direction of n channel MISFET is arranged so that it may become parallel to the crystal orientation <100> of a semiconductor substrate, since it is hard to extend a nickel silicide region in the direction of crystal orientation <100>, even if it is a case where a nickel silicide region is formed in the source and drain of n channel MISFET, the semiconductor device in which OFF leakage current does not increase easily is obtained. When the front surface of the portion which adjoins a source and a drain in the channel width direction of n channel MISFET among element isolation film IS has fallen rather than the front surface of the source and the drain especially, in conventional <110> channel MISFET, although it is easy to extend the nickel silicide region on a source and a drain in the direction of crystal orientation <110>, according to the present invention, the increase in OFF leakage current can be suppressed effectively.

Even if it is n channel MISFET in which the generation of depression of the above element isolation films ISa generated, when the silicide region on a source and a drain is $NiSi_2$, there is an effect which a nickel silicide region cannot extend in the direction of crystal orientation <100> as easily as the case where a silicide region is NiSi.

Even if it is n channel MISFET in which the generation of depression of the above element isolation films ISa generated, as shown in Embodiment 2, when at least the neighborhood of a main front surface includes silicon and germanium, the nickel silicide region on a source and a drain will be easily set to $NiSi_2$ by the generation of strain among semiconductor substrates.

Even if it is n channel MISFET in which the generation of depression of the above element isolation films ISa generated, when a gate silicide region is NiSi, it is low resistance from the case where a gate silicide region is $NiSi_2$.

In description of above-mentioned Embodiment 1-3 and the modification shown after FIG. 13, the silicide region on a source and a drain was set to NiSi or $NiSi_2$. However, in recent years, a silicide region including the nickel alloy which added the alloying elements (for example, Pt, Ta, Hf, etc.) of several percent to Ni may be used. The diving phenomenon of a silicide region occurs about a silicide region including such a nickel alloy, and the present invention is effective also to such a silicide region.

What is claimed is:

1. A method of manufacturing a semiconductor device, comprising the steps of:
    (a) preparing a silicon substrate which has a main surface whose plane direction is a surface (100);
    (b) forming an n channel MISFET (Metal Insulator Semiconductor Field Effect Transistor) which has a gate electrode, a source region, a drain region and a channel whose channel length direction is parallel to a crystal orientation <100> of the silicon substrate; and
    (c) forming NiSi over the gate electrode and $NiSi_2$ over the source region and the drain region at the same steps.

2. A method of manufacturing a semiconductor device, comprising the steps of:
    (a) preparing a silicon substrate which has a main surface whose plane direction is a surface (100);
    (b) forming an n channel MISFET (Metal Insulator Semiconductor Field Effect Transistor) which has a gate electrode, a source region, a drain region and a channel whose channel length direction is parallel to a crystal orientation <100> of the silicon substrate;
    (c) forming a Ni film over the n channel MISFET;
    (d) performing first thermal annealing to react the Ni film with the gate electrode, the source region and the drain region;
    (e) removing an unreacted Ni film; and
    (f) performing second thermal annealing to form NiSi over the gate electrode and $NiSi_2$ over the source region and the drain region.

* * * * *